United States Patent [19]

Driver et al.

[11] 4,176,295
[45] Nov. 27, 1979

[54] HIGH PEAK POWER MICROWAVE GENERATOR USING LIGHT ACTIVATED SWITCHES

[75] Inventors: Michael C. Driver, Penn Hills; James G. Oakes, Franklin; John R. Davis, Export, all of Pa.

[73] Assignee: Westinghouse Electric Corp., Pittsburgh, Pa.

[21] Appl. No.: 915,649

[22] Filed: Jun. 15, 1978

[51] Int. Cl.$^2$ .......................... H03K 3/42; H03K 3/57
[52] U.S. Cl. ...................................... 315/39; 307/106; 307/117; 307/311; 328/61; 328/65; 331/55; 331/56; 331/107 P; 333/13
[58] Field of Search ...................... 331/46, 55, 56, 66, 331/96, 101, 107 DP, 107 P, 107 C; 307/311, 312, 106, 117; 328/61, 65; 315/39; 333/13

[56] References Cited

U.S. PATENT DOCUMENTS

| | | | |
|---|---|---|---|
| 3,628,171 | 12/1971 | Kurokawa et al. | 331/56 |
| 3,748,528 | 7/1973 | Cronson | 307/106 X |
| 3,984,788 | 10/1976 | Peyrat | 331/107 R |
| 4,135,099 | 1/1979 | Fiedor et al. | 307/312 X |

Primary Examiner—Siegfried H. Grimm
Attorney, Agent, or Firm—James J. Wood

[57] ABSTRACT

A high peak power microwave generator is disclosed in which a plurality of transmission lines are connected to an output wave guide at predetermined intervals along the direction of propagation. Each transmission line is periodically charged, and this electromagnetic energy is released into the wave guide upon the actuation of a light activated silicon switch (LASS) diode connected to the transmission line. The LASS diodes are actuated simultaneously by a laser beam which traverses equal optical paths to each switch. The coincident switching of the transmission lines enables the power in each line to be additive in the wave guide, and much higher output pulses can be obtained. Further, the high speed switching capabilities afforded by the LASS diodes means that the resulting high power can be obtained at a much higher frequency.

12 Claims, 6 Drawing Figures

HIGH PEAK POWER MICROWAVE GENERATOR USING LIGHT ACTIVATED SWITCHES

BACKGROUND OF THE INVENTION

1. Field of the Invention

This invention relates to a high peak power microwave generator using light activated switches.

2. Description of the Prior Art

The increasing need for high power pulse microwave sources for radar and electronic counter measure applications has focussed attention on the advantages of solid state devices by reason of their size, weight and reliability. The prior art has utilized the following semiconductor devices as microwave sources: bipolar transistors, field effect transistors, Gunn effect diodes and avalanche diodes.

Typical of the prior art is U.S. Pat. No. 3,628,171 to Kurokawa et al for "Microwave Power Combining Oscillator Circuits". In accordance with the teachings of this patent, a plurality of negative resistance avalanche devices, such as the impact avalanche and transit time (IMPATT) diode, are mounted on one end of a coaxial cable, the other end of which is terminated by a matched impedance. The midportion of each cable is coupled to a common cavity resonator to provide a combined power output which is delivered by a wave guide connected to the resonator.

A similar microwave oscillator using the IMPATT type avalanche diodes is described in U.S. Pat. No. 3,984,788 to Peyrat entitled "Negative Resistance Microwave Power Generator". A plurality of IMPATT diodes are connected at one end to a coaxial transmission line, the other end of which terminates in an impedance close to the characteristic impedance of the coaxial line. These transmission lines are electromagnetically coupled to a common cavity resonator. At least one additional oscillator is electrically coupled to the resonator at a point where the electric field is at a maximum, thereby increasing the volumetric power delivered by 50%. The generated electromagnetic energy is transmitted to an external circuit, i.e. an antenna or the like through a wave guide.

For power levels above tens or hundreds of watts, the semiconductor devices enumerated above have not proven satisfactory. The size of devices needed for high power generation places a limit on their response time, making them unusable at microwave frequencies.

SUMMARY OF THE INVENTION

A microwave generator is provided in which at least two transmission lines are connected at intervals along the length of a wave guide means. At least two light sensitive switches are electrically connected respectively to each of the transmission lines. Direct current energizing means are connected to the transmission lines. Means are provided for periodically sending a laser beam to said light sensitive switches whereby the periodic actuation of said light sensitive switches causes the electromagnetic energy in the transmission lines to be coupled into the wave guide means from whence it is propagated as a pulse train of microwave energy.

DESCRIPTION OF THE PREFERRED EMBODIMENT

Figure 1:
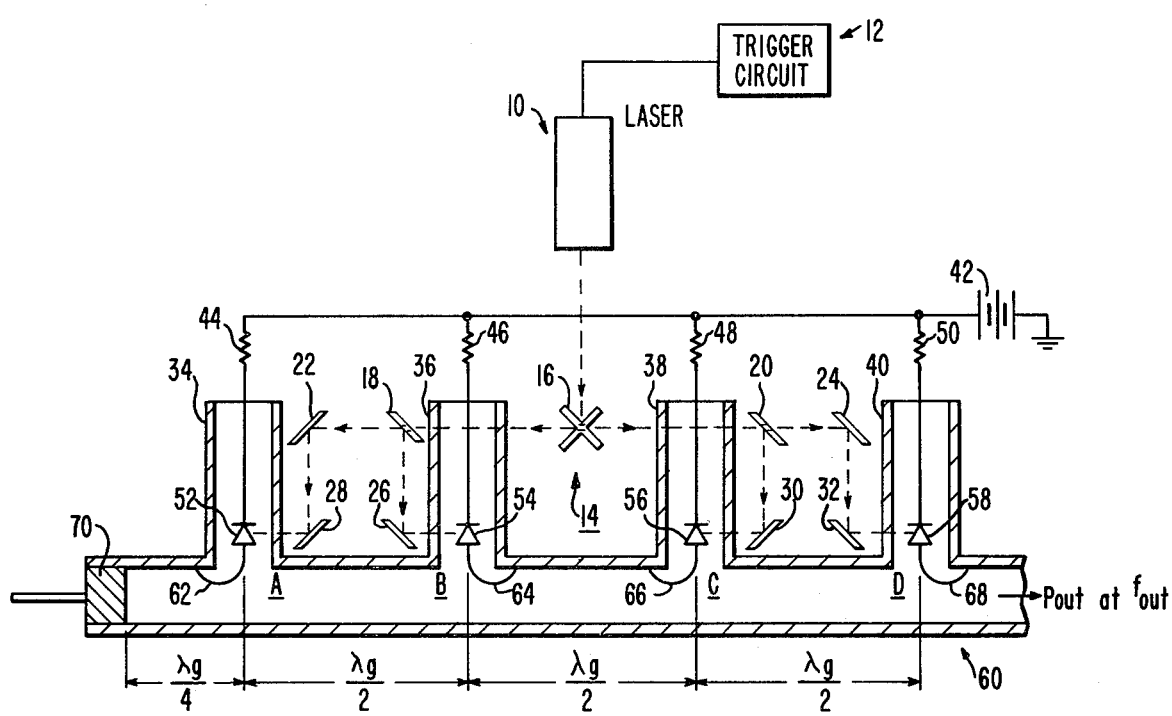
FIG. 1 is a schematic diagram of the high peak power microwave generator in accordance with the invention.

Referring now to FIG. 1, a laser source, symbolically identified at 10, is triggered on from a trigger circuit 12. Typically, the laser source may be a Nd:YAG (neodymium: yttrium, aluminum garnet) laser, or a neodymium glass laser or any other laser which provides a wave length in the order of 1.0 to 1.1 micrometers.

The beam from the laser 10 is directed toward an optical system, indicated generally at 14, and comprising a split beam mirror 16 and a plurality of inclined mirrors 18, 20, 22, 24, 26, 28, 30 and 32. As may be seen from a study of the schematic of FIG. 1, mirrors 18 and 20 are apertured so that the laser beam is passed through to mirrors 22 and 24 respectively. From mirrors 18 and 22 the laser beam is deflected to mirrors 26 and 28 respectively; similarly, from mirrors 20 and 24 the laser beam is deflected to mirrors 30 and 32 respectively.

The laser beam is arranged to travel in equal optical paths to the situs of laser actuated semiconductor switches, illustrated in this application as LASS switching diodes which will subsequently be identified. Thus, for example where the laser beam paths are physically unequal in length, they can be made optically equal by inserting appropriate amounts of glass material in the shorter paths to slow down the laser beam in order to insure coincident arrival at all the LASS diodes. Additionally while mirrors are here used to discipline the laser beam to a selected path, it is also possible to use fiber optics (i.e. light pipes) to provide the equal optical paths.

A plurality of resonant transmission lines are identified generally at 34, 36, 38 and 40; these transmission lines are here illustrated as coaxial lines but microstrip and strip transmission lines may also be used.

The coaxial lines 34, 36, 38 and 40 each have a central and an outer conductor, the central conductor being connected at one end to a d.c. voltage source 42; through resistors 44, 46, 48 and 50 respectively, while the other ends terminate in LASS diodes 52, 54, 56, 58 in series with coupling loops identified at 62, 64, 66 and 68 respectively. The laser activated silicon switch (LASS) has extremely fast turn on times in the range of nanoseconds and even sub-nanoseconds.

The outer cylindrical conductors (unnumbered) of the resonant transmission lines 34, 36, 38, 40 are constructed as shown so as to be integral with a wave guide illustrated generally at 60. The outer walls of the wave guide 60 and the outer cylindrical conductors of the coaxial lines 34, 36, 38 and 40 are all at the same reference potential as the battery source 42. The outer conductors each include a small aperture (not shown) to permit egress of the laser beam to the situs of the LASS diodes 52, 54, 56 and 58. The areas of union of the resonant transmission lines with the wave guide 60 define stations which are identified as A, B, C and D. As will be seen from a study of FIG. 1, coupling loops 62 and 66 face one way while coupling loops 64 and 68 face in the opposite direction.

The wave guide 60 includes a movable shorted end 70 which is used for empirical adjustment prior to use; the microwave power is propagated from the open end of the wave guide as indicated by the arrow and the caption P out at $f_{out}$. The resonant transmission line 34 is located nominally a quarter wave length ($\lambda_g/4$) from the shorted end 70 of the wave guide, and each of the resonant transmission lines are spaced a half wave length ($\lambda g/2$) from each other. The wavelength ($\lambda g$) in the wave guide is equal to:

$$\lambda g = \frac{f_{out}}{\text{the velocity of propagation in the wave guide}}$$

Where $f_{out}$ is the output frequency.

The resonant transmission lines each have a length equal to $\lambda T/2$ at $f_{out}$:

$$\lambda T = \frac{f_{out}}{\text{velocity of the energy propagated within the resonant line}}$$

Where $\lambda T$ equals the wave length in the transmission line.

OPERATION

The operation of the microwave generator will now be discussed by reference to FIG. 1 and the FIGS. 2A through 2E.

Energy is stored in the resonant transmission lines from the d.c. voltage source 42 (d.c. current flow is blocked by the LASS diodes 52, 54, 56 and 58). At a predetermined time interval, the laser 10 is triggered, and simultaneously all four LASS diodes 52, 54, 56 and 58 conduct. The d.c. current through loops 62, 64, 66 and 68 results in electromagnetic energy being coupled into the wave guide 60. Two wave trains are formed one moving toward the right and one toward the left as viewed in FIG. 2A. By reason of the physical arrangement of the loops, the energy pulses are alternately positive and negative polarity. At $t=0$ in FIG. 2A, the pulses A, B, C and D have the position shown, pulses A being generated at station A, pulses B being generated at station B etc.

In order to simplify this explanation, we shall ignore the energy pulses already moving toward the right because they will continue this way until they emerge from the wave guide 60. Our attention will thus be concentrated solely on the wave energy moving toward the left to the shorted end 70 of the wave guide.

When an energy pulse reaches the shorted end 70 two things happen: (a) the pulse will be reflected to the right and (b) the pulse will be inverted. At the end of one cycle ($t=1/f$) shown in FIG. 2B, pulse A has traveled one wave length and is at station B; note that it has been inverted. Further, at the end of one cycle pulse B has also traveled one wave length and is now at station A; note that it too has been inverted. In this same time interval, i.e. $t=1/f$, pulses C and D have advanced to station A and station B respectively; note that they have not been reflected as yet and are still moving to the left.

Figure 2A:
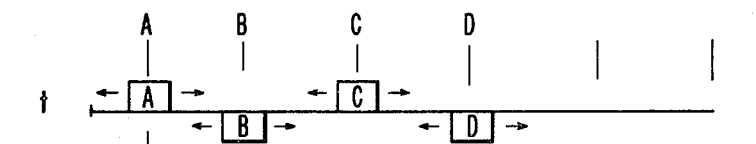
FIGS. 2A through 2E are symbolic peak waveforms used in explaining the invention of FIG. 1.
Figure 2B:
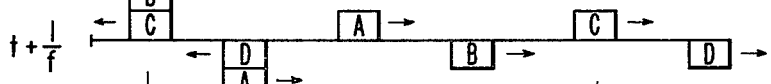
Figure 2C:
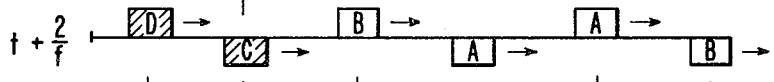
Figure 2D:
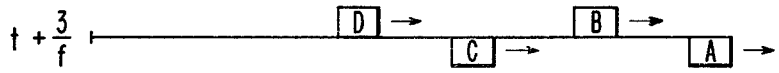
Figure 2E:
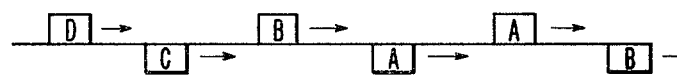

At the end of the interval $t+2/f$ (FIG. 2C) energy pulses D and C will be reflected to the right as shown by the cross hatched areas in FIG. 2C. At the end of $t+3/f$, FIG. 2D, the pulses D and C will have advanced to stations C and D respectively, and by $t+4/f$ they will be propagated out of the wave guide 60. As a result of this a uniform power pulse train of four cycle duration is generated as shown in FIG. 2E.

After a time interval sufficient to allow the voltage source 42 to recharge the transmission lines 34, 36, 38 and 40, the laser 10 can now be triggered again to generate the next series of power pulses. However, in radar application, the nature of the radar system may determine the timing of the firing of the laser 10. For example, if it is desirable to wait for the return reflected pulse from a target before transmitting new pulses, then obviously a longer time interval for laser activation is indicated, while in a continuous wave (CW) radar system this factor would have no weight in the selection of the rate of firing the laser source 10.

We claim:
1. A microwave generator comprising:
   (a) wave guide means;
   (b) at least two resonant transmission lines connected at intervals along the length of said wave guide means;
   (c) light sensitive switch means electrically connected respectively to each of said transmissions lines;
   (d) direct current energizing means connected to said transmission lines; and
   (e) means for periodically sending a laser beam to said light sensitive switch means, whereby the actuation of said switch means causes the electromagnetic energy in the transmission lines to be coupled into the wave guide means from whence it is propagated as a pulse train.

2. A microwave generator according to claim 1 wherein:
   said resonant transmission lines are arranged at half wave length intervals with respect to each other, and said wave guide means includes a closed end which is a quarter wave length from one of said resonant transmission lines.

3. A microwave generator according to claim 1 wherein:
   each resonant transmission line is a coaxial line comprising an inner conductor having a coupling loop portion and an outer conductor, said inner conductor being connected in series with said light sensitive switch means and said direct current energizing means, the coupling loop portion extending within the interior of the wave guide means, the outer conductor being connected with the outer wall of the wave guide means.

4. A microwave generator according to claim 3 wherein:
   said coupling loop portions are physically arranged within said wave guide means so as to produce alternating positive and negative pulses.

5. A microwave generator according to claim 1 wherein:
   said light sensitive switch means includes a LASS diode.

6. A microwave generator according to claim 1 wherein:
   said direct current energizing means is a battery source of direct current potential.

7. A microwave generator according to claim 1 wherein:
   said periodic laser beam means comprises a laser trigger circuit, a laser beam source and an optical system, said trigger circuit being connected to periodically actuate the laser beam source, the optical system being arranged to receive the laser beam and transmit and reflect it to the situs of said light sensitive switch means.

8. A microwave generator comprising:
   (a) a wave guide means;
   (b) at least two resonant transmission lines each having an inner conductor including a loop portion and an outer conductor, said resonant transmission lines being connected to the wave guide means at intervals along the direction of propagation of the wave guide means, said loop portion extending within the wave guide means;

(c) direct current energizing means connected with said resonant transmission lines;

(d) at least two light sensitive semiconductors each light sensitive semiconductor being connected with the respective inner conductor and in series with said direct current energizing means;

(e) a laser beam source;

(f) means for periodically triggering said laser beam source;

(g) optical means in the path of said laser beam for passing and reflecting the laser beam in equal optical paths to the situs of said light sensitive semiconductors;

whereby when said laser beam is actuated, electromagnetic energy is coupled to said wave guide means where it is reflected and propagated to produce a pulse train from the wave guide means.

9. A microwave generator according to claim 8 wherein said resonant transmission lines are spaced at half wave intervals with respect to each other along said wave guide means, and said wave guide means includes a closed end portion which is a quarter wave length from one of said resonant transmission lines.

10. A microwave generator according to claim 8 wherein said loop portions are physically arranged within said wave guide means so as to produce alternating positive and negative pulses of energy.

11. A microwave generator according to claim 8 wherein said light sensitive semiconductors are LASS diodes.

12. A microwave generator according to claim 8 wherein said direct current energizing means is a battery source of direct current potential.

* * * * *